United States Patent
Li et al.

(10) Patent No.: US 11,273,553 B2
(45) Date of Patent: Mar. 15, 2022

(54) ADAPTING SIMULATION DATA TO REAL-WORLD CONDITIONS ENCOUNTERED BY PHYSICAL PROCESSES

(71) Applicant: AUTODESK, INC., San Rafael, CA (US)

(72) Inventors: Hui Li, San Francisco, CA (US); Evan Patrick Atherton, San Carlos, CA (US); Erin Bradner, San Francisco, CA (US); Nicholas Cote, San Francisco, CA (US); Heather Kerrick, Oakland, CA (US)

(73) Assignee: AUTODESK, INC., San Rafael, CA (US)

( * ) Notice: Subject to any disclaimer, the term of this patent is extended or adjusted under 35 U.S.C. 154(b) by 770 days.

(21) Appl. No.: 15/995,003

(22) Filed: May 31, 2018

(65) Prior Publication Data

US 2018/0349527 A1   Dec. 6, 2018

Related U.S. Application Data

(60) Provisional application No. 62/515,456, filed on Jun. 5, 2017.

(51) Int. Cl.
    *B25J 9/16* (2006.01)
    *G06N 20/00* (2019.01)
    *G05B 19/418* (2006.01)
    *G06N 3/04* (2006.01)
    *G06N 3/08* (2006.01)
    (Continued)

(52) U.S. Cl.
    CPC ............ *B25J 9/1671* (2013.01); *B25J 9/161* (2013.01); *B25J 9/163* (2013.01); *B25J 9/1605* (2013.01); *G05B 19/41885* (2013.01); *G06F 30/20* (2020.01); *G06N 3/0445* (2013.01); *G06N 3/08* (2013.01); *G06N 20/00* (2019.01);
    (Continued)

(58) Field of Classification Search
    CPC .............................. B25J 9/1671; G06T 17/00
    USPC ............................................. 345/419; 706/12
    See application file for complete search history.

(56) References Cited

U.S. PATENT DOCUMENTS 6,675,189 B2    1/2004  Rehg et al.
9,183,676 B2 *  11/2015 McCulloch ........... G06T 19/006
(Continued)

OTHER PUBLICATIONS

Non-Final Office Action received for U.S. Appl. No. 15/995,005 dated Jul. 29, 2019, 11 pages.
(Continued)

*Primary Examiner* — David T Welch

(74) *Attorney, Agent, or Firm* — Artegis Law Group, LLP

(57) ABSTRACT

One embodiment of the present invention sets forth a technique for generating simulated training data for a physical process. The technique includes receiving, as input to at least one machine learning model, a first simulated image of a first object, wherein the at least one machine learning model includes mappings between simulated images generated from models of physical objects and real-world images of the physical objects. The technique also includes performing, by the at least one machine learning model, one or more operations on the first simulated image to generate a first augmented image of the first object. The technique further includes transmitting the first augmented image to a training pipeline for an additional machine learning model that controls a behavior of the physical process.

20 Claims, 5 Drawing Sheets

(51) Int. Cl.
*G06F 30/20* (2020.01)
*G06T 17/00* (2006.01)

(52) U.S. Cl.
CPC .... *G06T 17/00* (2013.01); *G05B 2219/32017* (2013.01); *G05B 2219/35353* (2013.01)

(56) References Cited

U.S. PATENT DOCUMENTS

| | | | |
|---|---|---|---|
| 9,547,746 | B1 | 1/2017 | Gaudette et al. |
| 10,297,070 | B1 | 5/2019 | Zhu et al. |
| 10,360,515 | B2* | 7/2019 | Arai .......................... G06N 3/08 |
| 10,733,876 | B2* | 8/2020 | Moura ............... G06K 9/00785 |
| 10,867,417 | B2* | 12/2020 | Han ....................... G06T 11/008 |
| 2008/0316205 | A1 | 12/2008 | Jaynes |
| 2008/0316206 | A1 | 12/2008 | Jaynes et al. |
| 2011/0020779 | A1 | 1/2011 | Hannaford et al. |
| 2014/0122391 | A1 | 5/2014 | Mugan et al. |
| 2015/0106306 | A1 | 4/2015 | Birdwell et al. |
| 2015/0339589 | A1 | 11/2015 | Fisher |
| 2016/0034809 | A1 | 2/2016 | Trenholm et al. |
| 2016/0035093 | A1* | 2/2016 | Kateb .................... G02B 23/24 382/131 |
| 2016/0162786 | A1 | 6/2016 | Grudic et al. |
| 2016/0284095 | A1* | 9/2016 | Chalom ................. G06K 9/627 |
| 2018/0012411 | A1* | 1/2018 | Richey .................. G06T 19/006 |
| 2018/0028294 | A1* | 2/2018 | Azernikov .......... A61C 13/0004 |
| 2018/0075581 | A1* | 3/2018 | Shi ....................... G06N 3/0472 |
| 2018/0117446 | A1 | 5/2018 | Tran et al. |
| 2018/0181802 | A1* | 6/2018 | Chen .................... G06N 3/0454 |
| 2018/0225823 | A1* | 8/2018 | Zhou .................... G06N 3/0454 |
| 2018/0341836 | A1* | 11/2018 | Lim ....................... G06T 7/0002 |
| 2018/0349527 | A1 | 12/2018 | Li et al. |
| 2019/0057520 | A1 | 2/2019 | Cinnamon et al. |
| 2020/0118423 | A1* | 4/2020 | Moura ................. G08G 1/0116 |
| 2020/0167161 | A1* | 5/2020 | Blanche ................. G06T 15/20 |
| 2020/0265745 | A1* | 8/2020 | Buras ..................... A61B 8/461 |
| 2020/0268349 | A1* | 8/2020 | Buras .................... A61B 8/4263 |

OTHER PUBLICATIONS

Levine et al. "Learning Hand-Eye Coordination for Robotic Grasping with Deep Learning and Large-Scale Data Collection", arXiv:1603.02199v4 [cs.LG], Aug. 28, 2016, 12 pages.

Tobin et al. "Domain Randomization for Transferring Deep Neural Networks from Simulation to the Real World", arXiv:1703.06907v1 [cs.RO], Mar. 20, 2017, 8 pages.

Camozzato, Daniel, "A Method for Growth-Based Procedural Floor Plan Generation" URL: https://pdfs.semanticscholar.org/4606/b08a7c0f33771fd645fbdd6dce1a60a9db09.pdf, 2015, 76 pages.

Lopes et al. "A Constrained Growth Method for Procedural Floor Plan Generation", URL: https://graphics.tudelft.nl/~rafa/myPapers/bidanra.GAMEON10.pdf, 8 pages.

* cited by examiner

ADAPTING SIMULATION DATA TO REAL-WORLD CONDITIONS ENCOUNTERED BY PHYSICAL PROCESSES

CROSS-REFERENCE TO RELATED APPLICATIONS

This application claims the benefit of United States provisional patent application titled "ROBOT TRAINING WITH SYNTHETIC DATA," filed on Jun. 5, 2017 and having Ser. No. 62/515,456. The subject matter of this related application is hereby incorporated herein by reference.

BACKGROUND

Field of the Various Embodiments

Embodiments of the present invention relate generally to simulation data, and more particularly, to adapting simulation data to real-world conditions encountered by physical processes.

Description of the Related Art

Physical processes can include tasks or actions performed by industrial robots, three-dimensional (3D) printers, machine tools, self-driving cars, and/or other automated technologies. Such automated technologies are commonly trained using machine learning techniques or programmed to carry out the tasks or actions. For example, an industrial robot may be trained or programmed to perform tasks such as welding, painting, assembly, pick-and-place of electronic components, packaging, and/or labeling. In another example, a self-driving car may utilize computer vision, control systems, and/or artificial intelligence to drive along a route between two points while avoiding obstacles and obeying traffic signals and signs without requiring human input.

Such physical processes are commonly trained, programmed, and/or augmented according to the environments in which the physical processes take place. For example, industrial robots that use visual feedback to perform a grasping or assembly task may be trained using real-world images collected from an environment that is similar to the environment in which the industrial robots are designed to operate (e.g., a factory or factory-like environment).

However, collecting real-world data for use in training and/or programming physical processes can be tedious, inefficient, and/or difficult to scale. Continuing with the above example, an industrial robot may be trained to perform a grasping or assembly task using images and/or perception data collected from other robots. Thus, collection or generation of training data for the robot may require the configuration and use of the other robots in numerous trial-and-error scenarios until an adequate amount of visual and/or perception data is obtained from the other robots to perform the necessary training operations.

To alleviate the time and expense associated with using real-world data to train or program physical processes, some or all of the real-world data may be replaced with synthetic or simulation data that is meant to replicate real-world conditions. For example, training data representing visual feedback for industrial robots may be generated from computer aided design (CAD) models of objects to be grasped or manipulated by the industrial robots. Because the training data is produced in a simulated environment, labels representing the positions and orientations of the objects can be automatically generated, and the training data can be scaled to different types of robots, tasks, and/or objects.

One drawback of using synthetic training data, however, is that synthetic data is typically unable to capture or accurately reflect all real-world conditions experienced by the physical processes. For example, images generated from CAD models of objects may lack the shading, lighting, and/or noise that is present in real-world images of the same objects. As a result, the synthetic data may require manual processing or augmentation by humans to better reflect real-world conditions before the synthetic data can be used to train or execute the physical processes effectively.

As the foregoing illustrates, what is needed in the art are more effective techniques for using synthetic data to train or execute physical processes.

SUMMARY

One embodiment of the present invention sets forth a technique for generating simulated training data for a physical process. The technique includes receiving, as input to at least one machine learning model, a first simulated image of a first object, wherein the at least one machine learning model includes mappings between simulated images generated from models of physical objects and real-world images of the physical objects. The technique also includes performing, by the at least one machine learning model, one or more operations on the first simulated image to generate a first augmented image of the first object. The technique further includes transmitting the first augmented image to a training pipeline for an additional machine learning model that controls a behavior of the physical process.

At least one advantage and technological improvement of the disclosed techniques is simulated images can be used as training data for visual perception in a physical process. As a result, the training data may be generated in a scalable, automated fashion without degrading the performance of the physical process in visually perceiving objects in a real-world setting. Consequently, the disclosed techniques provide technological improvements in the efficiency, flexibility, and effectiveness of training and executing physical processes using simulation data.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one of skilled in the art that the inventive concepts may be practiced without one or more of these specific details.

System Overview

Figure 1:
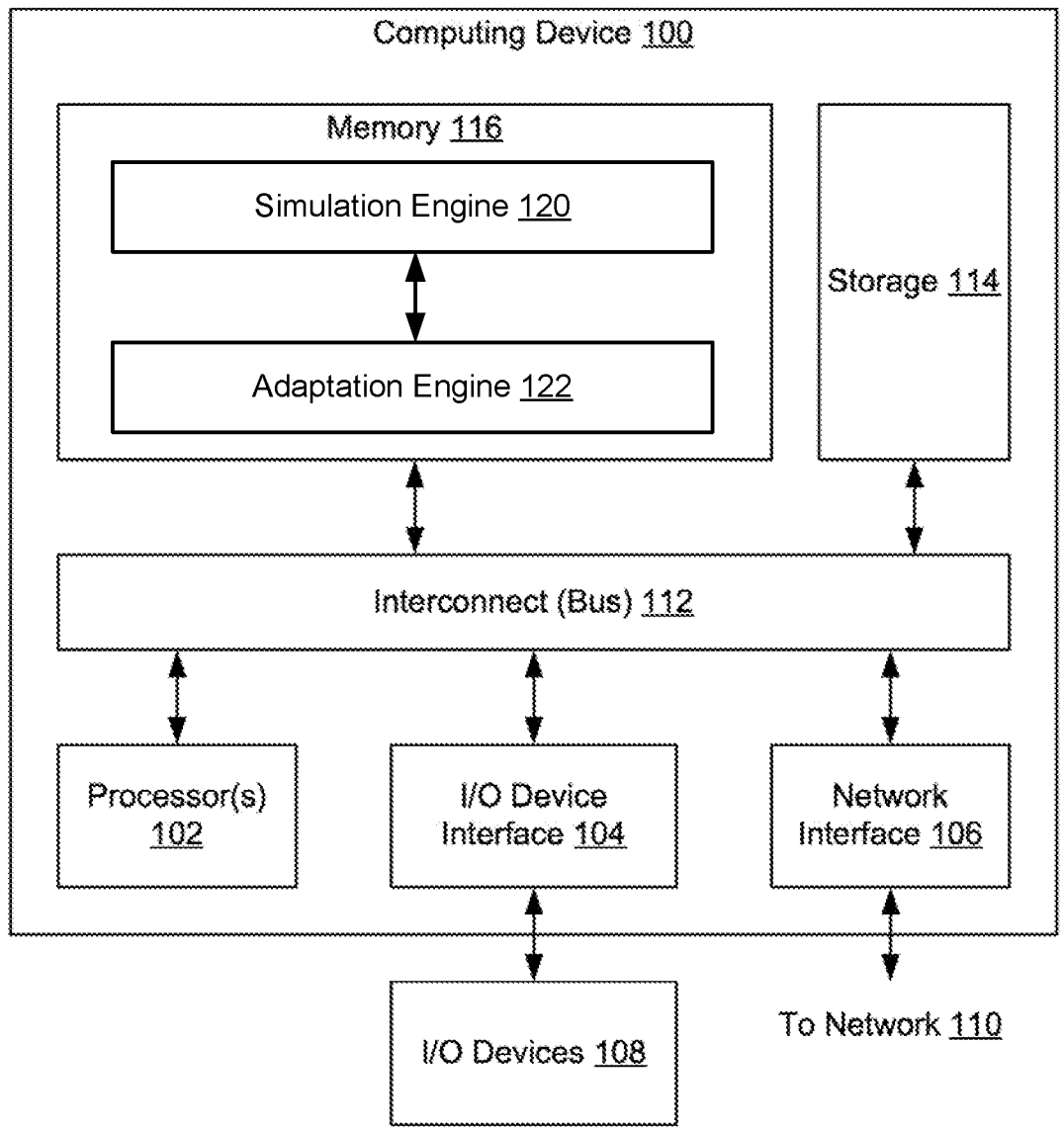
FIG. 1 illustrates a computing device configured to implement one or more aspects of the present invention.

FIG. 1 illustrates a computing device 100 configured to implement one or more aspects of the present invention. Computing device 100 may be a desktop computer, a laptop computer, a smart phone, a personal digital assistant (PDA), tablet computer, or any other type of computing device configured to receive input, process data, and optionally display images, and is suitable for practicing one or more embodiments of the present invention. Computing device 100 is configured to run productive congestion application 150 that resides in a memory 116. In some embodiments, computing device 100 is also configured to run space design application 118. It is noted that the computing device described herein is illustrative and that any other technically feasible configurations fall within the scope of the present invention.

As shown, computing device 100 includes, without limitation, an interconnect (bus) 112 that connects one or more processing units 102, an input/output (I/O) device interface 104 coupled to one or more input/output (I/O) devices 108, memory 116, a storage 114, and a network interface 106. Processing unit(s) 102 may be any suitable processor implemented as a central processing unit (CPU), a graphics processing unit (GPU), an application-specific integrated circuit (ASIC), a field programmable gate array (FPGA), any other type of processing unit, or a combination of different processing units, such as a CPU configured to operate in conjunction with a GPU. In general, processing unit(s) 102 may be any technically feasible hardware unit capable of processing data and/or executing software applications, including positive congestion application 150. Further, in the context of this disclosure, the computing elements shown in computing device 100 may correspond to a physical computing system (e.g., a system in a data center) or may be a virtual computing instance executing within a computing cloud.

I/O devices 108 may include devices capable of providing input, such as a keyboard, a mouse, a touch-sensitive screen, and so forth, as well as devices capable of providing output, such as a display device. Additionally, I/O devices 108 may include devices capable of both receiving input and providing output, such as a touchscreen, a universal serial bus (USB) port, and so forth. I/O devices 108 may be configured to receive various types of input from an end-user (e.g., a designer) of computing device 100, and to also provide various types of output to the end-user of computing device 100, such as displayed digital images or digital videos or text. In some embodiments, one or more of I/O devices 108 are configured to couple computing device 100 to a network 110.

Network 110 may be any technically feasible type of communications network that allows data to be exchanged between computing device 100 and external entities or devices, such as a web server or another networked computing device. For example, network 110 may include a wide area network (WAN), a local area network (LAN), a wireless (WiFi) network, and/or the Internet, among others.

Storage 114 may include non-volatile storage for applications and data, and may include fixed or removable disk drives, flash memory devices, and CD-ROM, DVD-ROM, Blu-Ray, HD-DVD, or other magnetic, optical, or solid state storage devices. Space design application 118 and productive congestion application 150 may be stored in storage 114 and loaded into memory 116 when executed. Additionally, one or more architectural space designs (not shown) and corresponding data may be stored in storage 114.

Memory 116 may include a random access memory (RAM) module, a flash memory unit, or any other type of memory unit or combination thereof. Processing unit(s) 102, I/O device interface 104, and network interface 106 are configured to read data from and write data to memory 116. Memory 116 includes various software programs that can be executed by processor(s) 102 and application data associated with said software programs, including a simulation engine 120 and an adaptation engine 122.

Simulation engine 120 may produce simulation data in a simulated or virtual environment that is subsequently used to control the execution of a physical process. The physical process may include an industrial robot, three-dimensional (3D) printer, machine tool, self-driving car, and/or another type of automated technology. As a result, the physical process may be configured to perform tasks such as assembly, sorting, manufacturing, welding, painting, pick-and-place of electronic components, packaging, labeling, 3D printing, machining, navigating, and/or avoiding obstacles.

In particular, simulation data from simulation engine 120 may be used to train, program, and/or execute the physical process. For example, the simulation data may include images that are generated from computer-aided design (CAD) models of physical objects. The images may be used to train industrial robots that use visual feedback and/or perception to perform grasping, sorting, and/or assembly tasks. In another example, the simulation data may include a sequence of simulated operations or kinematic poses for performing a task in a virtual environment, such as a virtual reality environment. The simulated operations or kinematic poses may then be used to control the execution of a physical process that performs the task in a physical world, including, but not limited to, a factory, assembly line, research lab, underground location (e.g., mine, drill hole, cave, etc.), underwater location, high-altitude location, and/or extraterrestrial location (e.g., planet, moon, asteroid, comet, space station, spacecraft, outer space, etc.).

Those skilled in the art will appreciate that simulation data is typically unable to capture or accurately reflect all real-world conditions experienced or encountered by a physical process. For example, images generated from CAD models of objects may lack the shading, lighting, and/or noise that is present in real-world images of the same objects. In another example, simulated output for controlling the movement or kinematic pose of a physical process in a virtual environment may fail to accurately capture the physical conditions of a real-world environment.

In one or more embodiments, adaptation engine 122 includes functionality to adapt simulation data generated by simulation engine 120 in a simulated environment to real-world conditions encountered by physical processes that are executed using the simulation data. As described in further detail below, adaptation engine 122 may use one or more machine learning models to identify and/or characterize the gap between the simulation data and real-world data that can be used to effectively control the execution of a physical process. As a result, adaptation engine 122 may improve the training, programming, and/or execution of the physical process using simulation data that is generated by simulation engine 120 in an automated and/or scalable fashion instead of requiring manual modification of the simulation data to better reflect real-world conditions or manual collection of real-world data in a real-world environment.

Augmenting Simulated Training Data for a Physical Process

Figure 2A:
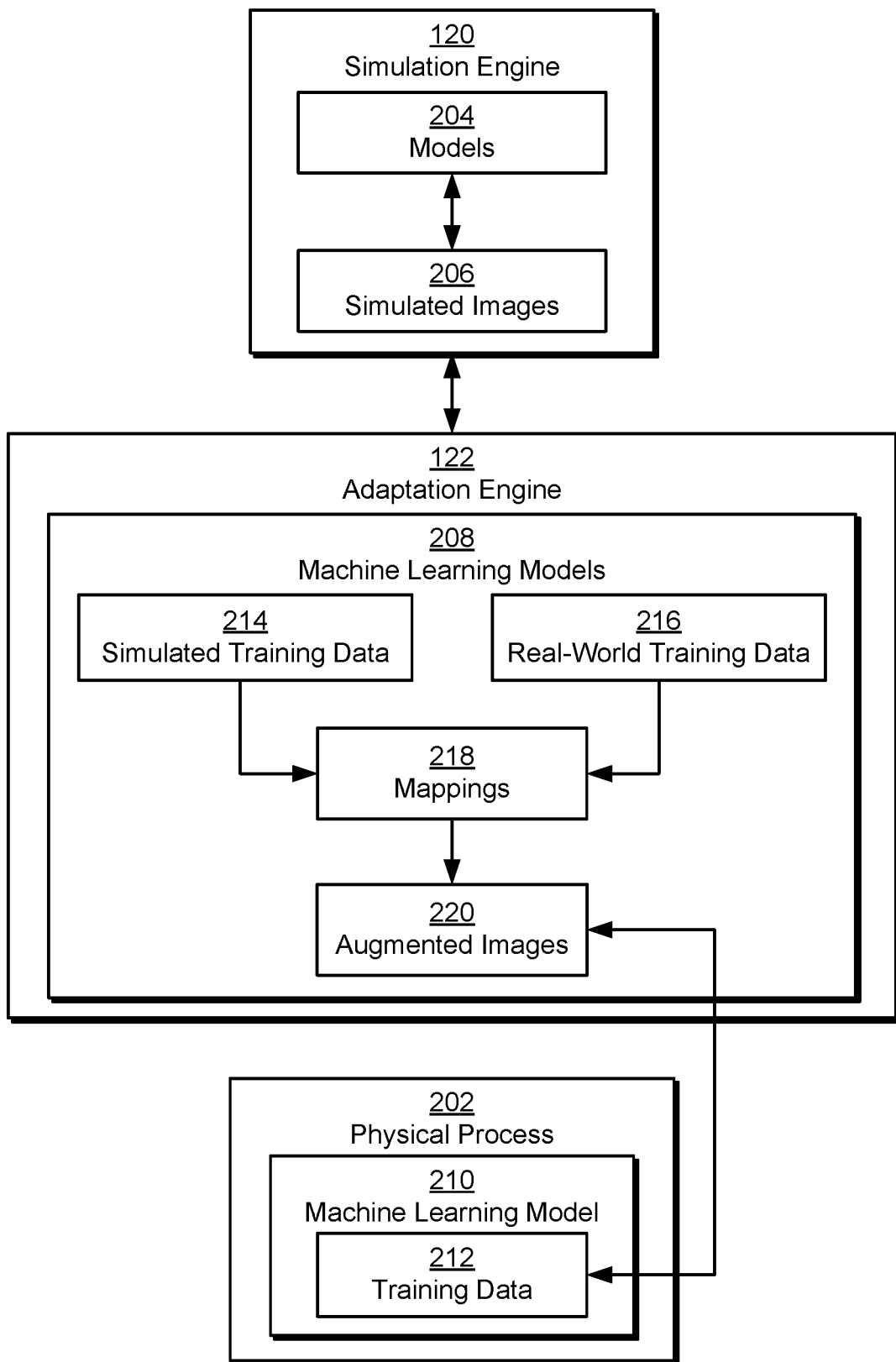
FIGS. 2A-2B are more detailed illustrations of the simulation engine and adaptation engine of FIG. 1, according to various embodiments of the present invention.

FIG. 2A is a more detailed illustration of simulation engine 120 and adaptation engine 122 of FIG. 1, according to various embodiments of the present invention. More specifically, FIG. 2A shows the use of simulation engine 120 and adaptation engine 122 in generating or augmenting training data 212 for physical processes that perform tasks involving visual perception. For example, simulation engine 120 and adaptation engine 122 may be used to generate, as training data 212, images of objects that are inputted into an artificial neural network and/or other type of machine learning model 210 that performs visual perception in a physical process 202 such as an industrial robot. In turn, machine learning model 210 may generate output that is used to control the physical process during the execution of a task such as grasping, sorting, and/or mechanical assembly.

As illustrated in FIG. 2A, generation of training data 212 begins with simulation engine 120, which uses models 204 of physical objects to produce simulated images 206 containing the objects. For example, simulation engine 120 may use CAD models of blocks, electronic components, hardware, engine components, automotive components, aerospace components, and/or composite materials to generate simulated images 206 containing three-dimensional (3D) renderings of the corresponding objects in a two-dimensional (2D) array of pixels. Simulated images 206 may optionally contain depth information and/or 3D locations associated with the rendered objects (e.g., x, y, and/or z coordinates of corners, edges, or other features in the objects). To improve the robustness and/or accuracy of physical process 202 in performing the task, simulation engine 120 may be configured to produce simulated images 206 that contain a variety of different objects, including "distractor" objects that are not relevant to the task; simulated images 206 of objects in different positions and/or orientations; and/or simulated images 206 that reflect different camera positions and/or viewing angles of the objects.

Simulation engine 120 may also generate labels that are used with training data 212 to train machine learning model 210 in physical process 202. For example, simulation engine 120 may output, in metadata that is embedded in each simulated image and/or stored separately from the simulated image, the type of every object in the simulated image, one or more graspable points on the object (e.g., edges, handles, dimensions, etc.), the position and orientation of the object in the simulated image, one or more 3D locations associated with the object (e.g., x, y, and/or z coordinates of corners, edges, or other features in the object), and/or the camera position and viewing angle used to produce the simulated image.

While such depictions may accurately capture the dimensions, materials, and/or appearance of the objects, simulated images 206 may lack the shading, lighting, noise, and/or other real-world conditions that are present in real-world images of the same objects. As a result, direct use of simulated images 206 as training data 212 may result in suboptimal performance in machine learning model 210 and/or physical process 202 when such real-world conditions are encountered by physical process 202. For example, using only simulated images 206 to train machine learning model 210 may interfere with subsequent prediction and/or identification of real-world objects, object positions, and/or object orientations by machine learning model 210 during use of physical process 202 in a real-world setting (e.g., performing a task in a factory or lab environment).

To improve the training and execution of machine learning model 210 and/or physical process 202, adaptation engine 122 may apply one or more other machine learning models 208 to simulated images 206 to produce augmented images 220 of the objects. Machine learning models 208 may identify and/or include mappings 218 between simulated images 206 of objects generated by simulation engine 120 and real-world images of the same objects. To produce mappings 218, machine learning models 208 may be trained using simulated training data 214 that includes simulated images 206 and real-world training data 216 that includes real-world images of the same objects (e.g, images of the objects captured by cameras mounted on other robots). After mappings 218 are generated (e.g., after machine learning models 208 are trained), machine learning models 208 may produce, from simulated images 206, augmented images 220 of the objects that are highly similar to and/or effectively indistinguishable from real-world images of the same objects.

For example, machine learning models 208 may include one or more types of generative adversarial networks (GANs), such as cycle GANs, Wasserstein GANs, and/or deep convolutional GANs. The GANs may include a generator neural network that produces augmented images 220 from simulated images 206 generated by simulation engine 120, as well as a discriminator neural network that categorizes augmented images 220 as simulated or real. The GANs may be trained by inputting simulated training data 214 and real-world training data 216 as unpaired training data into the generator and discriminator neural networks. The generator and discriminator neural networks may then be trained against static versions of one another (e.g., using gradient descent to minimize loss functions for the generator and discriminator neural networks).

As the generator and discriminator neural networks are trained against each other, the generator neural network may produce more realistic augmented images 220, and the discriminator neural network may learn to better distinguish between augmented images 220 and real-world images. After training is complete, the generator neural network may learn the distributions of simulated training data 214 and real-world training data 216, and the discriminator neural network may learn to predict the probability that a given image is simulated or real.

The trained machine learning models 208 may then be used to produce, from simulated images 206 of objects, augmented images 220 that mimic real-world images of the same objects. For example, machine learning models 208 may increase the "realness" of simulated images 208 containing CAD models 204 of the objects on a white background by adding shading, lighting, noise, and/or other real-world "effects" to simulated images 208 to produce augmented images 220. Since machine learning models 208 are trained using real-world training data 216 containing images collected from an environment that is identical or similar to the one in which physical process 202 operates, augmented images 220 may imitate the shading, lighting, noise, and/or other real-world conditions encountered by physical process 202 in performing the task. Augmented images 220 and the corresponding labels (e.g., object positions, object orientations, object types, graspable points in each object, depth information and/or 3D locations of objects or features in augmented images 220, etc.) from simulation engine 120 may then be used as training data 212 for machine learning model 210. For example, augmented images 220 and the labels may allow a neural network and/or other type of machine learning model 210 to learn the positions, orientations, and types of objects in augmented images 220. Because augmented images 220 have characteristics that reflect real-world conditions encountered by physical process 202, machine learning model 210 may perform better in visually perceiving objects in a real-world setting (e.g., a lab, factory, field environment, etc.) than if machine learning model 210 were trained using only simulated images 206.

Augmenting Simulated Output for Controlling the Execution of a Physical Process

Figure 2B:
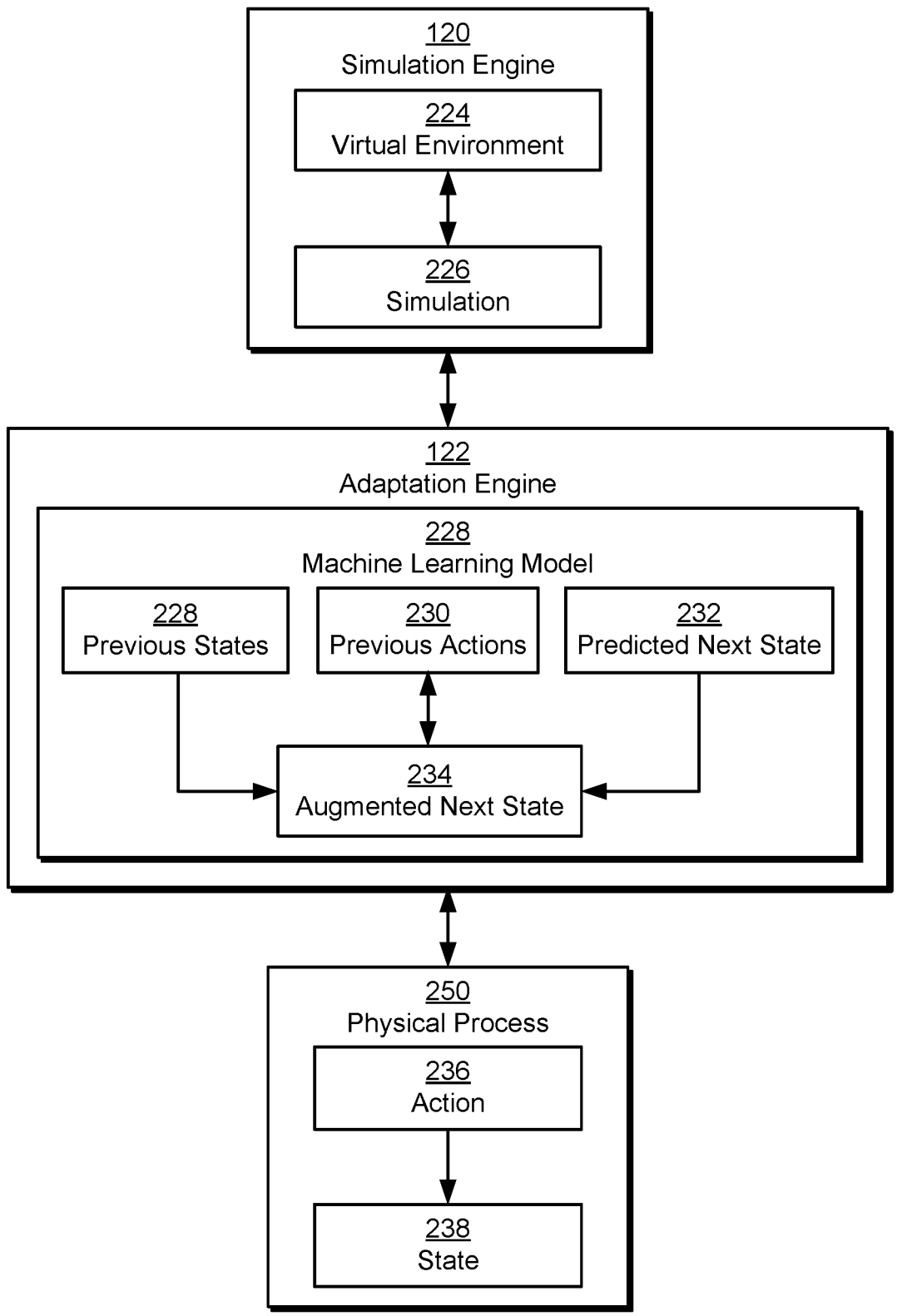

FIG. 2B is a more detailed illustration of simulation engine 120 and adaptation engine 122 of FIG. 1, according to various embodiments of the present invention. More specifically, FIG. 2B shows the use of simulation engine 120 and adaptation engine 122 in adapting simulated output for controlling the behavior of a physical process in a virtual environment 224 to real-world conditions in which the physical process operates. For example, simulation engine 120 and adaptation engine 122 may convert simulated output from a simulation 226 of one or more robots interacting with one or more objects in a virtual reality environment into augmented output that can be used to control the robots' interaction with the objects in a real, physical world.

As shown in FIG. 2B, simulation engine 120 may run simulation 226 to obtain simulated output for controlling how the physical process performs a task in virtual environment 224. For example, simulation engine 120 may provide simulation 226 in a virtual reality environment in which users and/or other entities (e.g., animals, robots, machine learning systems, etc.) can generate simulated output for controlling the behavior of the physical process in performing a task such as interacting with an object, 3D printing, machining, assembly, grasping, mining, walking, cleaning, and/or drilling. Within simulation 226, the entities may interact with the virtual reality environment to generate simulated output representing a kinematic solution for performing the task in the virtual reality environment.

Simulation engine 120 may configure simulation 226 and/or virtual environment 224 to reflect a real-world environment in which physical process 250 operates. For example, simulation 226 may be conducted in a virtual reality environment that replicates the layout of the real-world environment, objects or dimensions in the real-world environment, and/or constraints on the physical process (e.g., limitations on speed, movement, power, temperature, etc.) in the real-world environment.

In turn, simulation 226 may produce a model for executing physical process 250 according to the conditions captured by virtual environment 224. For example, simulation 226 may generate a recurrent neural network and/or other type of model that outputs a predicted next state 232 represented by a position and orientation of a robot, as well as additional positions and orientations of one or more objects with which the robot interacts, based on the current states of the robot and object(s). Predicted next state 232 may be generated or selected to allow the robot to carry out the task in virtual environment 224. That is, the model produced by simulation 226 may output a series of predicted next states that advance the robot from an initial state, in which the task is incomplete, to a final state, in which the task is complete.

Continuing with the above example, predicted next state 232 may be inputted into an inverse kinematics solver that generates a command to the robot based on the predicted position and orientation. More specifically, the inverse kinematics solver may determine if predicted next state 232 is reachable by the robot. If predicted next state 232 can be reached by the robot, the inverse kinematics solver may output a command for actuating the robot in a way that causes the robot to reach the corresponding position and orientation. If predicted next state 232 cannot be reached by the robot, the inverse kinematics solver generates a command for moving the robot into a reachable position and orientation. The command results in a new "current state" of the robot, which is then inputted back into the recurrent neural network to generate a new predicted next state 232. Thus, the recurrent neural network and inverse kinematics solver may iteratively produce a new predicted next state 232 and corresponding command until the robot's execution of the task is complete.

On the other hand, simulation 226 and/or virtual environment 224 may fail to accurately capture the physics, conditions, or constraints of a real-world environment in which physical process 250 operates. For example, gravity, temperature, air pressure, fluid dynamics, rigid body dynamics, soft-body dynamics, friction, and/or other conditions may be modeled in simulation 226 and/or virtual environment 224 in a way that differs slightly or significantly from those in the real-world environment. Simulated output for controlling the behavior of physical process 250 in virtual environment 224 may thus deviate from real-world output for effecting the same result in a real-world setting, thereby resulting in suboptimal performance of physical process 250 in the real world.

At the same time, physical conditions and/or constraints associated with physical process 250 may differ across real-world environments. For example, temperature, gravity, air pressure, dynamics, fluid properties, friction, and/or conditions may differ across laboratory environments, factory environments, underwater environments, high elevation environments, underground environments, high-humidity environments, low-humidity environments, and/or other environments in which physical process 250 may execute.

To improve the performance of physical process 250 in a variety of real-world environments, adaptation engine 122 may provide an "adapter" between simulation 226 in virtual environment 224 and each physical world in which physical process 250 executes. Continuing with the above example, a different instance of adaptation engine 122 may be configured to convert simulated output for controlling the execution of physical process 250 in virtual environment 224 into augmented output that is used to control the execution of physical process 250 in a given environment (e.g., laboratory, factory, field, etc.).

In particular, adaptation engine 122 may use a machine learning model 228 to learn or characterize differences between execution of physical process 250 in virtual environment 224 and execution of physical process 250 in a real, physical world. For example, machine learning model 228 may include a fully connected neural network and/or other type of predictive model that estimates augmented output for controlling the execution of process 250 in the physical world, given simulated output for controlling the execution of process 250 in virtual environment 224.

Input to machine learning model 228 may include predicted next state 232 and/or other simulated output for controlling the execution of physical process 250 in virtual environment 224. Input to machine learning model 228 may additionally include a set of previous states 228, a set of previous actions 230, and/or other real-world data collected from physical process 250 while physical process 250 performs the corresponding task in the physical world. For example, previous states 228 may include positions and orientations of a robot and/or one or more objects with which the robot is interacting, and previous actions 230 may include joint velocities of the robot.

In turn, augmented output generated by machine learning model 228 may include an augmented next state 234 of physical process 250. Continuing with the above example, augmented next state 234 may include augmented positions and orientations of the robot and one or more objects with which the robot interacts in the physical world. Augmented next state 234 may be passed into another inverse kinematics solver to generate a command that moves the robot and/or object(s) into the augmented positions and orientations, or into reachable positions and orientations that can be advanced into the augmented positions and orientations in a subsequent time step. After the command is carried out by the robot, an action 236 performed by the robot to reach a current state 238 of the robot and/or object(s) (e.g., the actual positions and orientations of the robot and/or object(s)) may be fed back into machine learning model 228 as the most recent previous action and most recent previous state of the robot and/or object(s), respectively.

Initially, learning by machine learning model 228 may be bootstrapped using predicted next state 232 and/or other simulated output for controlling physical process 250 in virtual environment 224. As a result, initial augmented output (e.g., augmented next state 234) from machine learning model 228 may be identical to simulated output (e.g., predicted next state 232) from simulation 226 in virtual environment 224. As the augmented output is used to produce a corresponding real-world action 236 and state 238 in physical process 250 executing in a physical world, action 236 and state 238 may be passed into machine learning model 228 as part of previous actions 230 and previous states 228 to allow machine learning model 228 to learn the difference between virtual environment 224 and the physical world.

As mentioned above, a different instance of adaptation engine 122 and/or machine learning model 228 may be deployed in each physical world in which physical process 25 operates to adapt simulation 226 to different physical worlds. In turn, each instance may learn, over time, to control the execution of physical process 250 in the corresponding physical world based on simulated output from simulation 226 and real-world data collected from process 250 executing in the physical world instead of requiring physical process 250 to be trained using data that is manually collected from each physical world.

Figure 3:
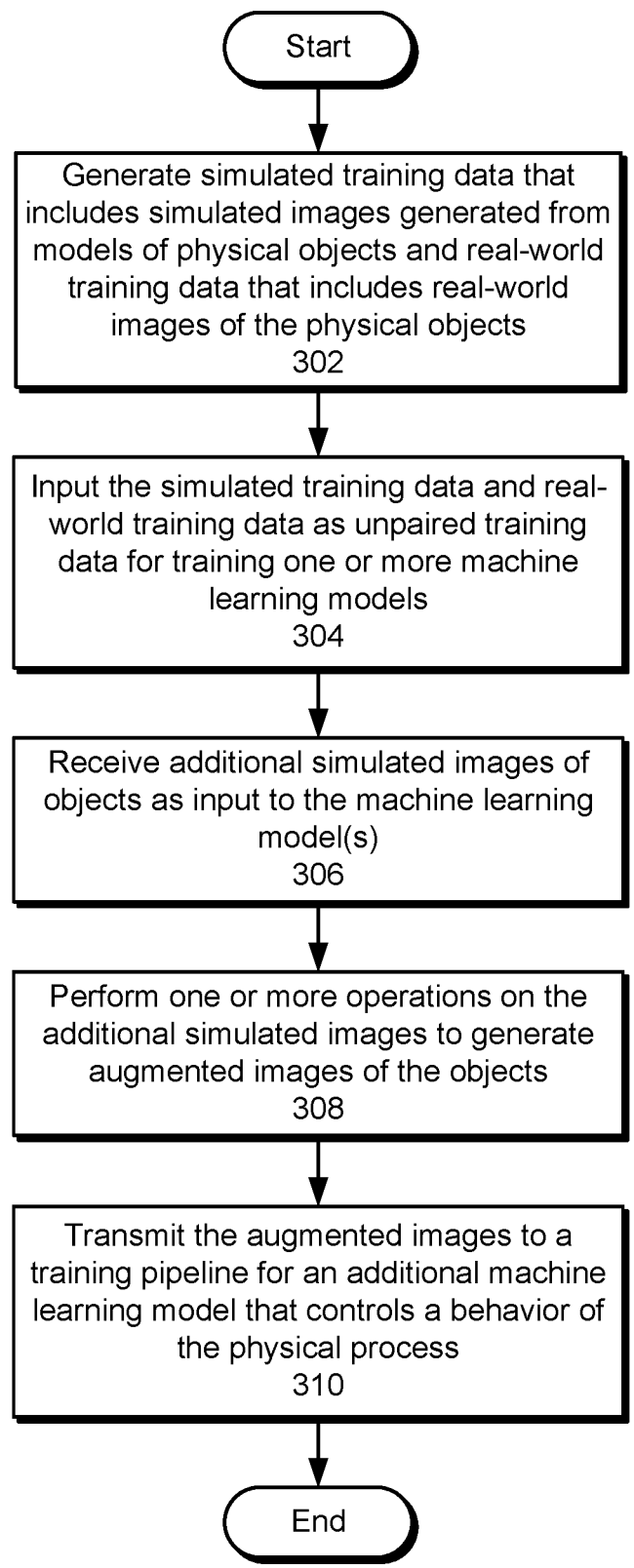
FIG. 3 is a flow diagram of method steps for generating simulated training data for a physical process, according to various embodiments of the present invention.

FIG. 3 is a flow diagram of method steps for generating simulated training data for a physical process, according to various embodiments of the present invention. Although the method steps are described in conjunction with the systems of FIGS. 1-2, persons skilled in the art will understand that any system configured to perform the method steps, in any order, is within the scope of the present invention.

Initially, simulation engine 120 and/or another component generates simulated training data that includes simulated images generated from models of physical objects and real-world training data that includes real-world images of the physical objects (operation 302). For example, the simulated images may include renderings of CAD models of blocks, electronic components, hardware, engine components, automotive components, aerospace components, composite materials, and/or other objects. The real-world images may be captured by cameras located on assemblies for carrying out the physical process, such as cameras on robots that perform grasping and/or assembly tasks by interacting with the objects. The real-world images may also, or instead, be captured by cameras in environments that replicate real-world conditions encountered by the physical process, such as an environment that reproduces the layout, physical setup, lighting, and/or shading of a laboratory or factory in which the physical process is to be deployed. The simulated and/or real-world images may optionally contain depth information and/or 3D locations associated with points in the images, such as features (e.g., corners, edges, visual markers, etc.) of objects in the images.

Next, the component inputs the simulated training data and real-world training data as unpaired training data for training one or more machine learning models (operation 304). For example, the simulated and real-world training data may be used to train a generator neural network that produces augmented images from simulated images and a discriminator neural network that categorizes augmented images produced by the generator neural network as simulated or real. The generator and discriminator neural networks may additionally be trained against one another, so that augmented images produced by the generator neural network from the simulated images are highly similar to or effectively indistinguishable from real-world images of the corresponding objects.

Adaptation engine 122 then receives simulated images of objects as input to the machine learning model(s) (operation 306). For example, adaptation engine 122 may receive the simulated images from simulation engine 120 and/or another source. Adaptation engine 122 and/or the machine learning model(s) also perform one or more operations on the simulated images to generate augmented images of the objects (operation 308). The operations may include shading operations, lighting operations, operations for adding noise, and/or operations for adding other real-world "effects" to the simulated images.

Finally, adaptation engine 122 and/or another component transmit the augmented images to a training pipeline for an additional machine learning model that controls a behavior of the physical process (operation 310). For example, the component may obtain, from simulation engine 120 and/or metadata associated with each simulated image and/or the corresponding augmented image, labels that include the type of every object in the augmented image, the position and orientation of every object in the augmented image, one or more graspable points of the object in the augmented image, and/or the camera position and viewing angle associated with the augmented image. The augmented images and corresponding labels may then be used to train an artificial neural network and/or another type of additional machine learning model for performing visual perception in the physical process.

Figure 4:
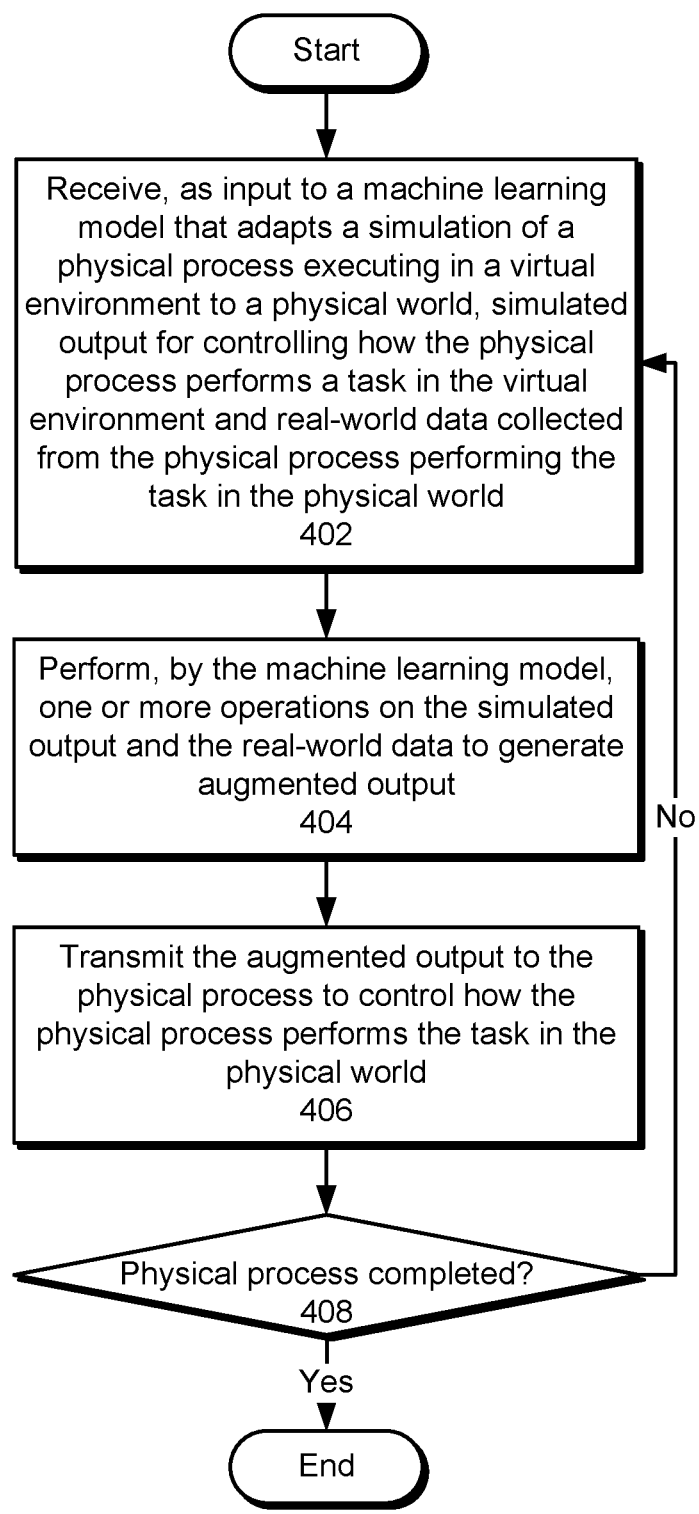
FIG. 4 is a flow diagram of method steps for controlling the execution of a physical process, according to various embodiments of the present invention.

FIG. 4 is a flow diagram of method steps for controlling the execution of a physical process, according to various embodiments of the present invention. Although the method steps are described in conjunction with the systems of FIGS. 1-2, persons skilled in the art will understand that any system configured to perform the method steps, in any order, is within the scope of the present invention.

As shown, adaptation engine 122 initially receives, as input to a machine learning model that adapts a simulation of a physical process executing in a virtual environment to a physical world, simulated output for controlling how the physical process performs a task in the virtual environment and real-world data collected from the physical process performing the task in the physical world (operation 402). The simulated output may include a predicted next state of the physical process, and the real-world data may include a set of previous states of the physical process and/or a set of previous actions performed by the physical process.

For example, the simulation may invoke an additional machine learning model produced by the simulation, such as a recurrent and/or other type of neural network that controls the interaction of a robot with an object in the virtual environment. The additional machine learning model may output, as the predicted next state, a predicted position and orientation of a robot, as well as predicted positions and orientations of one or more objects with which the robot interacts. The simulation may additionally invoke an inverse kinematics solver that generates a command to the robot based on the predicted position and orientation.

Next, the machine learning model performs one or more operations on the simulated output and the real-world data to generate augmented output (operation 404). Continuing with the above example, the machine learning model may be a fully connected and/or other type of neural network that produces, from the predicted position and orientation of the robot and the previous states and/or actions of the robot, an augmented next state that includes an augmented position and orientation of the robot in the physical world.

The augmented output is transmitted to the physical process to control how the physical process performs the task in the physical world (operation 406). Continuing with the above example, the augmented position and orientation may be passed into another inverse kinematics solver to generate a command that moves the robot into the augmented position and orientation, or into a reachable position and orientation that can be advanced into the augmented position and orientation in a subsequent time step.

Operations 402-406 may be repeated until the physical process has completed execution (operation 408). Continuing with the above example, the robot's newest position and/or latest action may be inputted into the machine learning model, along with the newest predicted position and orientation of the robot from the additional machine learning model. The machine learning model may output an updated augmented position and orientation of the robot (and of any objects with which the robot interacts), and the inverse kinematics solver may generate a new command (e.g., a command to move the joints of the robot in a certain way) to correspondingly update the position and orientation of the robot (and of any objects with which the robot interacts). After the command is carried out by the robot, the action performed by the robot in response to the command and the current state of the robot (e.g., the actual positions and orientations of the robot and objects) may be fed back into the machine learning model as the most recent previous action and most recent previous state of the robot, respectively. The positions and orientations of the robot and objects may thus continue to be updated based on previous actions, previous states, and output from the additional machine learning model until the task is complete (e.g., the execution of the robot in performing the task in the physical world reaches a final or satisfactory state).

In sum, the disclosed techniques utilize machine learning models to bridge the gap between simulation and reality in the training and execution of physical processes. A first machine learning model is trained to identify a gap between simulated images and real-world images. The first machine learning model is then used to generate or augment training data for physical processes that perform tasks involving visual perception, such as grasping and/or mechanical assembly. A second machine learning model provides an adapter between a simulated world and a real physical world. More particularly, the second machine learning model is used to adjust the behavior of a physical process to better reflect real-world conditions in which the physical process is actually operating.

In turn, the disclosed techniques may improve the use of simulation data in executing physical processes in one or more physical worlds. First, the adaptive, automatic addition of lighting, shading, noise, and/or other real-world conditions to simulated images may allow the use of the simulated images as training data for visual perception in a physical process. As a result, the training data may be generated in a scalable, automated fashion without degrading the performance of the physical process in visually perceiving objects in a real-world setting. Second, the on-the-fly adaptation of simulated output for controlling the execution of a task by a physical process in a virtual environment to one or more physical worlds in which the physical process operates may allow a simulation of the physical process in the virtual environment to be used in the physical worlds without manual modification or customization of the physical process to the conditions of each physical world. Consequently, the disclosed techniques provide technological improvements in the efficiency, flexibility, and effectiveness of training and executing physical processes using simulation data.

1. In some embodiments, a method comprises receiving, as input to at least one machine learning model, a first simulated image of a first object, wherein the at least one machine learning model includes mappings between simulated images generated from models of physical objects and real-world images of the physical objects; performing, by the at least one machine learning model, one or more operations on the first simulated image to generate a first augmented image of the first object; and transmitting the first augmented image to a training pipeline for an additional machine learning model that controls a behavior of the physical process.

2. The method of clause 1, wherein receiving the first simulated image of the first object comprises generating the first simulated image from a computer aided design (CAD) model of the first object.

3. The method of clauses 1 or 2, further comprising generating simulated training data that comprises the simulated images and real-world training data that comprises the real-world images; and inputting the simulated training data and the real-world training data as unpaired training data for training the at least one machine learning model.

4. The method of clauses 1-3, further comprising generating labels associated with the first simulated image; and transmitting the labels and the first augmented image as training data to the training pipeline.

5. The method of clauses 1-4, wherein the labels comprise a type of the first object, a graspable point on the first object, a position of the first object in the first augmented image, and an orientation of the first object in the first augmented image.

6. The method of clauses 1-5, wherein the additional machine learning model comprises an artificial neural network.

7. The method of clauses 1-6, wherein the at least one machine learning model comprises a generator neural network that produces augmented images from simulated images.

8. The method of clauses 1-7, wherein the at least one machine learning model further comprise a discriminator neural network that categorizes augmented images produced by the generator network as simulated or real.

9. The method of clauses 1-8, wherein the one or more operations performed by the at least one machine learning model comprise at least one of performing one or more shading operations on the first simulated image; performing one or more lighting operations on the first simulated image; and performing one or more operations that add noise to the first simulated image.

10. The method of clauses 1-9, wherein the physical process comprises a robot performing a grasping task.

11. In some embodiments, a non-transitory computer readable medium stores instructions that, when executed by a processor, cause the processor to perform the steps of receiving, as input to at least one machine learning model, a first simulated image of a first object, wherein the at least one machine learning model includes mappings between simulated images generated from models of physical objects and real-world images of the physical objects; performing, by the at least one machine learning model, one or more operations on the first simulated image to generate a first augmented image of the first object; and transmitting the first augmented image to a training pipeline for an additional machine learning model that controls a behavior of the physical process.

12. The non-transitory computer readable medium of clause 11, wherein the method further comprises generating simulated training data that comprises the simulated images and real-world training data that comprises the real-world images; and inputting the simulated training data and the real-world training data as unpaired training data for training the at least one machine learning model.

13. The non-transitory computer readable medium of clauses 11-12, wherein the method further comprises generating labels associated with the first simulated image; and transmitting the labels and the first augmented image as training data to the training pipeline.

14. The non-transitory computer readable medium of clauses 11-13, wherein the first simulated image and the first augmented image comprise at least one of a two-dimensional (2D) representation of the first object; and one or more three-dimensional (3D) locations associated with the first object.

15. The non-transitory computer readable medium of clauses 11-14, wherein the method further comprises performing, by the at least one machine learning model, the one or more operations on a second simulated image of a second object to generate a second augmented image of the second object; and transmitting the second augmented image to the training pipeline.

16. The non-transitory computer readable medium of clauses 11-15, wherein the at least one machine learning model comprises a generator neural network that produces augmented images from simulated images; and a discriminator neural network that categorizes augmented images produced by the generator network as simulated or real.

17. The non-transitory computer readable medium of clauses 11-16, wherein the additional machine learning model comprises an artificial neural network.

18. The non-transitory computer readable medium of clauses 11-17, wherein the one or more operations performed by the at least one machine learning model comprise at least one of performing one or more shading operations on the first simulated image; performing one or more lighting operations on the first simulated image; and performing one or more operations that add noise to the first simulated image.

19. The non-transitory computer readable medium of clauses 11-18, wherein the physical process comprises a robot performing a grasping task.

20. In some embodiments, a system comprises a memory that stores instructions, and a processor that is coupled to the memory and, when executing the instructions, is configured to receive, as input to at least one machine learning model, a first simulated image of a first object, wherein the at least one machine learning model includes mappings between simulated images generated from models of physical objects and real-world images of the physical objects; perform, by the at least one machine learning model, one or more operations on the first simulated image to generate a first augmented image of the first object; and transmit the first augmented image to a training pipeline for an additional machine learning model that controls a behavior of the physical process.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A method for generating simulated training data for a physical process, the method comprising:
   receiving, as input to at least one machine learning model, a first simulated image of a first object, wherein the at least one machine learning model includes mappings between simulated images generated from models of physical objects and real-world images of the physical objects;
   performing, by the at least one machine learning model, one or more operations on the first simulated image to generate a first augmented image of the first object; and
   transmitting the first augmented image as training data to a training pipeline that trains an additional machine learning model to control a behavior of the physical process.

2. The method of claim 1, wherein receiving the first simulated image of the first object comprises generating the first simulated image from a computer aided design (CAD) model of the first object.

3. The method of claim 1, further comprising:
   generating simulated training data that comprises the simulated images and real-world training data that comprises the real-world images; and
   inputting the simulated training data and the real-world training data as unpaired training data for training the at least one machine learning model.

4. The method of claim 1, further comprising:
   generating labels associated with the first simulated image; and
   transmitting the labels and the first augmented image as training data to the training pipeline.

5. The method of claim 4, wherein the labels comprise a type of the first object, a graspable point on the first object, a position of the first object in the first augmented image, and an orientation of the first object in the first augmented image.

6. The method of claim 1, wherein the additional machine learning model comprises an artificial neural network.

7. The method of claim 1, wherein the at least one machine learning model comprises a generator neural network that produces augmented images from simulated images.

8. The method of claim 7, wherein the at least one machine learning model further comprise a discriminator neural network that categorizes augmented images produced by the generator network as simulated or real.

9. The method of claim 1, wherein the one or more operations performed by the at least one machine learning model comprise at least one of:
   performing one or more shading operations on the first simulated image;
   performing one or more lighting operations on the first simulated image; and
   performing one or more operations that add noise to the first simulated image.

10. The method of claim 1, wherein the physical process comprises a robot performing a grasping task.

11. One or more non-transitory computer-readable media storing instructions that, when executed by one or more processors, cause the one or more processors to perform the steps of:
    receiving, as input to at least one machine learning model, a first simulated image of a first object, wherein the at least one machine learning model includes mappings between simulated images generated from models of physical objects and real-world images of the physical objects;
    performing, by the at least one machine learning model, one or more operations on the first simulated image to generate a first augmented image of the first object; and
    transmitting the first augmented image as training data to a training pipeline that trains an additional machine learning model to control a behavior of the physical process.

12. The one or more non-transitory computer-readable media of claim 11, wherein the method further comprises:
    generating simulated training data that comprises the simulated images and real-world training data that comprises the real-world images; and
    inputting the simulated training data and the real-world training data as unpaired training data for training the at least one machine learning model.

13. The one or more non-transitory computer-readable media of claim 11, wherein the method further comprises:
    generating labels associated with the first simulated image; and transmitting the labels and the first augmented image as training data to the training pipeline.

14. The one or more non-transitory computer-readable media of claim 11, wherein the first simulated image and the first augmented image comprise at least one of:
   a two-dimensional (2D) representation of the first object; and
   one or more three-dimensional (3D) locations associated with the first object.

15. The one or more non-transitory computer-readable media of claim 11, wherein the method further comprises:
   performing, by the at least one machine learning model, the one or more operations on a second simulated image of a second object to generate a second augmented image of the second object; and
   transmitting the second augmented image to the training pipeline.

16. The one or more non-transitory computer-readable media of claim 11, wherein the at least one machine learning model comprises:
   a generator neural network that produces augmented images from simulated images; and
   a discriminator neural network that categorizes augmented images produced by the generator network as simulated or real.

17. The one or more non-transitory computer-readable media of claim 11, wherein the additional machine learning model comprises an artificial neural network.

18. The one or more non-transitory computer-readable media of claim 11, wherein the one or more operations performed by the at least one machine learning model comprise at least one of:
   performing one or more shading operations on the first simulated image;
   performing one or more lighting operations on the first simulated image; and
   performing one or more operations that add noise to the first simulated image.

19. The one or more non-transitory computer-readable media of claim 11, wherein the physical process comprises a robot performing a grasping task.

20. A system, comprising:
   a memory that stores instructions, and
   a processor that is coupled to the memory and, when executing the instructions, is configured to:
      receive, as input to at least one machine learning model, a first simulated image of a first object, wherein the at least one machine learning model includes mappings between simulated images generated from models of physical objects and real-world images of the physical objects;
      perform, by the at least one machine learning model, one or more operations on the first simulated image to generate a first augmented image of the first object; and
      transmit the first augmented image as training data to a training pipeline that trains an additional machine learning model to control a behavior of the physical process.

\* \* \* \* \*